(12) United States Patent
Hsu

(10) Patent No.: US 10,133,180 B2
(45) Date of Patent: Nov. 20, 2018

(54) MICROELECTRONIC SUBSTRATE CLEANING COMPOSITIONS HAVING COPPER/AZOLE POLYMER INHIBITION

(71) Applicant: Avantor Performance Materials, Inc., Center Valley, PA (US)

(72) Inventor: Chien-Pin Sherman Hsu, Berkeley Heights, NJ (US)

(73) Assignee: AVANTOR PERFORMANCE MATERIALS, Center Valley, PA (US)

( * ) Notice: Subject to any disclaimer, the term of this patent is extended or adjusted under 35 U.S.C. 154(b) by 0 days.

(21) Appl. No.: 14/348,955

(22) PCT Filed: Oct. 5, 2012

(86) PCT No.: PCT/US2012/058976
§ 371 (c)(1),
(2) Date: Apr. 1, 2014

(87) PCT Pub. No.: WO2013/052809
PCT Pub. Date: Apr. 11, 2013

(65) Prior Publication Data
US 2014/0249065 A1  Sep. 4, 2014

Related U.S. Application Data

(60) Provisional application No. 61/626,915, filed on Oct. 5, 2011.

(51) Int. Cl.
| | |
|---|---|
| C11D 7/32 | (2006.01) |
| G03F 7/42 | (2006.01) |
| C11D 3/00 | (2006.01) |
| C11D 7/26 | (2006.01) |
| C11D 7/34 | (2006.01) |
| C11D 7/50 | (2006.01) |
| C11D 11/00 | (2006.01) |
| H01L 21/02 | (2006.01) |
| H01L 21/311 | (2006.01) |

(52) U.S. Cl.
CPC .......... G03F 7/425 (2013.01); C11D 3/0073 (2013.01); C11D 7/261 (2013.01); C11D 7/265 (2013.01); C11D 7/3281 (2013.01); C11D 7/34 (2013.01); C11D 7/5022 (2013.01); C11D 11/0047 (2013.01); H01L 21/02057 (2013.01); H01L 21/31133 (2013.01); C11D 7/263 (2013.01)

(58) Field of Classification Search
CPC ..... C11D 11/0047; C11D 7/3218; C11D 3/43; C11D 7/263; C11D 3/0073
See application file for complete search history.

(56) References Cited

U.S. PATENT DOCUMENTS

| | | | |
|---|---|---|---|
| 2003/0144162 A1 | 7/2003 | Chae et al. | |
| 2004/0147421 A1* | 7/2004 | Charm | C11D 7/3218 |
| | | | 510/176 |
| 2005/0048397 A1 | 3/2005 | Jo et al. | |
| 2006/0094612 A1* | 5/2006 | Kimura | C11D 3/0073 |
| | | | 510/175 |
| 2008/0076688 A1 | 3/2008 | Barnes et al. | |
| 2008/0103078 A1 | 5/2008 | Inaoka | |
| 2008/0125342 A1 | 5/2008 | Visintin et al. | |
| 2008/0139436 A1* | 6/2008 | Reid | C11D 3/044 |
| | | | 510/176 |
| 2008/0242574 A1 | 10/2008 | Rath et al. | |
| 2008/0287333 A1 | 11/2008 | Inaoka | |
| 2009/0118153 A1 | 5/2009 | Rath et al. | |
| 2009/0156453 A1 | 6/2009 | Inaoka | |
| 2009/0163396 A1 | 6/2009 | Hsu | |
| 2009/0170037 A1 | 7/2009 | Choung et al. | |
| 2009/0215658 A1 | 8/2009 | Minsek et al. | |
| 2009/0239777 A1 | 9/2009 | Angst et al. | |
| 2013/0296214 A1* | 11/2013 | Barnes | H01L 21/02063 |
| | | | 510/176 |

FOREIGN PATENT DOCUMENTS

| | | |
|---|---|---|
| EP | 1138726 A1 | 10/2001 |
| EP | 1178359 A2 | 2/2002 |
| EP | 1402963 A2 | 3/2004 |
| EP | 1447440 A1 | 8/2004 |
| EP | 1505146 A1 | 2/2005 |
| EP | 1519234 A2 | 3/2005 |
| EP | 1701218 A2 | 9/2006 |
| EP | 1752829 A2 | 2/2007 |
| WO | 2003064581 A1 | 8/2003 |
| WO | 2006110645 A2 | 10/2006 |
| WO | 2007036728 A1 | 4/2007 |
| WO | 2007044447 A2 | 4/2007 |
| WO | 2007111694 A2 | 10/2007 |
| WO | 2007120259 A2 | 10/2007 |
| WO | 2008039730 A1 | 4/2008 |
| WO | 2008080097 A2 | 7/2008 |
| WO | 2008121952 A1 | 10/2008 |
| WO | 2009058072 A1 | 5/2009 |

\* cited by examiner

*Primary Examiner* — Gregory E Webb
(74) *Attorney, Agent, or Firm* — Hoffmann & Baron, LLP

(57) ABSTRACT

Semi-aqueous, alkaline microelectronic cleaning composition of pH ≥8 containing:
(A) at least one secondary alkanolamine that generates hydroxides when in contact with water;
(B) at least one organic alcohol ether solvent having an evaporation rate of 0.3 or less when n-butyl acetate's evaporation rate is taken as the baseline rate of 1.0;
(C) at least one corrosion inhibiting cyclic amide compound;
(D) at least one pH balancing azole metal corrosion inhibitor in an amount of 0.08% or less by weight of the composition; and
(E) water;
and optionally
(F) at least one polyhydroxylated phenol compound corrosion inhibitor; and
(G) at least one polyalcohol or polythiol surface modification agent containing vicinal hydroxyl or vicinal sulfhydryl groups to pair with the polyhydroxylated phenol compound corrosion inhibitor.

18 Claims, No Drawings

MICROELECTRONIC SUBSTRATE CLEANING COMPOSITIONS HAVING COPPER/AZOLE POLYMER INHIBITION

The present application is a National Phase of International Application No. PCT/US2012/058976, filed 5 Oct. 2012, which claims priority to U.S. Provisional Application No. 61/626,915, filed 5 Oct. 2011. Priority is claimed to both these applications, which are both herein incorporated by reference in their entirety.

FIELD OF THE INVENTION

This invention relates to compositions useful in cleaning microelectronic substrates by removing photoresist, UV/plasma hardened photoresist and post plasma etch or post etch/ash residue and being able to do so while being compatible with aluminum, copper and low-k dielectrics, and particularly porous low-k dielectrics. In particular the invention provides substantially semi-aqueous based cleaner compositions and also provides method for cleaning microelectronic substrates and devices employing such compositions.

BACKGROUND TO THE INVENTION

Semiconductor devices have been produced by the steps of coating an inorganic substrate with a photoresist; patterning the photoresist film by exposure to light and subsequent development; etching exposed region of the inorganic substrate using the patterned photoresist film as a mask to form minute circuits; and removing the patterned photoresist film from the inorganic substrate. Alternatively, after forming minute circuits in the same manner as above, the patterned photoresist film is ashed, and then the remaining resist residues are removed from the inorganic substrate.

To strip photoresist (PR), UV/plasma hardened PR and plasma etch/ash residues, common organic solvents alone are generally not effective to provide required cleaning capability. Special active agents such as fluorides and alkaline bases are frequently used in microelectronic formulations. However, many bases such as amines and ammonium hydroxides will lead severe metal corrosion. Utilization of corrosion inhibitors may alleviate/minimize such metal corrosion, but generally can not provide enough protection for severe corrosion situations/formulations. Thus, working compositions need to be totally or "reasonably compatible" with metal without corrosion inhibitors. To meet modern microelectronic performance requirement, "reasonably compatible" is defined as "have metal etch rate of 20 Å/min or less". "Totally compatible" is defined as "have metal etch rate of 8 Å/min or less".

Microelectronic compositions at basic pH frequently encounter poor metal stack compatibility during wet PR stripping and subsequent water rinse processes. Galvanic corrosion of metal stacks poses even greater challenges. Utilization of corrosion inhibitors often result in surface modifications or leave residues on surface, leading to undesirable electric performance variations.

Among the many type of corrosion inhibitors suggested for use in such microelectronic cleaning compositions are azoles, particularly tetrazole and triazoles, and especially benzotriazole, and they have been employed at levels of 0.2 to 2% or more. Examples of cleaners with the mention of such azoles, especially benzotriazole, use as a corrosion inhibitor include, but are not limited to EP 1 178 359, EP 1,752,829, WO 2007/111694, US 2009/0170037, and WO 2007/044446. These cleaning compositions suggesting use of benzotriazole as a corrosion inhibitor are generally non-aqueous, organic solvent based cleaning compositions. But US 2003/144162 in paragraph [0042] indicates that benzotriazole does not prevent copper corrosion. However, although such triazoles appear to provide reasonably good copper protection from corrosion in some cases, generally in non-aqueous solvent based cleaner compositions, we have found that triazoles, such as benzotriazole, has a strong tendency to form a tightly bound polymer complex on the copper surfaces, which is believed to be a Cu ion/azole complex, such as Cu ion/benzotriazole complex, hereafter referred to as Cu (1)/azole and Cu (I)/BZT polymers, respectively. Such Cu (I)/azole polymer formation leads to detrimental effects if such polymer deposition is too thick or is not controlled. When benzotriazole is employed as a corrosion inhibitor the undesirable formation of such Cu(I)/BZT polymer is especially prevalent on copper surfaces and results in thick Cu(I)/BZT polymer especially when one of the major solvent components, dimethyl sulfoxide (DMSO), is employed in the cleaning compositions with benzotriazole. These Cu (I)/BZT polymers have been discovered to tightly bind to the copper surface and remain on the copper surface after typical water rinse processes employed following the stripping/cleaning process. Such problem has been found to be prevalent in substrates intended for flat panel displays.

Another class of metal, and especially copper or aluminum, corrosion inhibitors proposed for use in such cleaning compositions are polyhydroxylated phenol compounds containing vicinal hydroxyl groups, such as catechol, pyrogallol, and gallic acid. One disadvantage of the use of such polyhydroxylated phenol compounds as corrosion inhibitors is their tendency to bind tightly to silanols on the silicon wafers being cleaned. Such binding, even in small amounts modifies the silicon surface and causes degrading performances.

There is therefore a need for a microelectronics cleaning composition that can employ azole corrosion inhibitors that have no or minimized or inhibited Cu(I)/azole polymer formation. There is particularly a need for such cleaning composition that may be semi-aqueous and that does not produce significant metal corrosion even during the aqueous wash phase following cleaning of the substrates with the cleaning composition. An additional need is to have such compositions that are good performers for cleaning both aluminum and copper metallized microelectronic devices. A further need is to provide such cleaning compositions that inhibit binding of polyhydroxylated phenol compounds, employed as corrosion inhibitors, to silanols on the silicon wafers being cleaned and thereby inhibit surface modification of the microelectronic substrates by the polyhydroxylated phenol corrosion inhibitors.

SUMMARY OF THE INVENTION

The cleaning compositions of this invention are semi-aqueous, alkaline microelectronic cleaning composition of pH ≥8 comprising, consisting essentially of, or consisting of:
(A) at least one secondary alkanolamine that generates hydroxides when in contact with water;
(B) at least one organic alcohol ether solvent having an evaporation rate of 0.3 or less when n-butyl acetate's evaporation rate is taken as the baseline rate of 1.0;
(C) at least one corrosion inhibiting cyclic amide compound;

(D) at least one pH balancing azole metal corrosion inhibitor in an amount of 0.08% or less by weight of the composition; and
(E) water;
and optionally
(F) at least one polyhydroxylated phenol compound corrosion inhibitor; and
(G) at least one polyalcohol or polythiol surface modification agent containing vicinal hydroxyl or vicinal sulfhydryl groups to pair with the polyhydroxylated phenol compound corrosion inhibitor.
If component (F) is present in the compositions of this invention then component (G) is also present. However, the compositions may contain component (G) without having component (F) present.
The cleaning compositions of this invention may also optionally contain other non-essential but sometimes desirable components such as, for example,
(H) at least one polar organic solvent/co-solvent selected from sulfoxides, sulfones, amides, lactones, ethers, alcohols, tertiary alkanolamines, and alcohol ethers other than those employed as component (B); and
(I) at least one surfactant; and
(J) at least one metal chelating or complexing agent.

The compositions of this invention may be employed to clean microelectronic substrates by removing photoresist, UV/plasma hardened photoresist and post plasma etch or post etch/ash residue and being able to do so while being compatible with aluminum, copper and low-k dielectrics, and particularly porous low-k dielectrics. To accomplish cleaning of the microelectronic substrates or devices the microelectronic substrates or devices are contacted with the compositions of this invention for a time and at a temperature sufficient to accomplish such cleaning.

DETAILED DESCRIPTION OF THE INVENTION

The cleaning compositions of this invention are microelectronic cleaning compositions that can employ azole corrosion inhibitors that have no or minimized or inhibited Cu(I)/BZT polymer formation. Such microelectronic cleaning compositions are semi-aqueous, alkaline microelectronic cleaning composition of pH ≥8 comprising, consisting essentially of, or consisting of:
(A) at least one secondary alkanolamine that generates hydroxides when in contact with water;
(B) at least one organic alcohol ether solvent having an evaporation rate of 0.3 or less when n-butyl acetate's evaporation rate is taken as the baseline rate of 1.0;
(C) at least one corrosion inhibiting cyclic amide compound;
(D) at least one pH balancing azole metal corrosion inhibitor in an amount of 0.08% or less by weight of the composition; and
(E) water.
Such compositions are capable of cleaning both aluminum and copper metalized microelectronic substrates and such substrates also having low-k dielectrics. The substrates may be any of the substrates employed in microelectronic device fabrication, and especially silicon wafers and glass substrates.

In another embodiment of the cleaning compositions of this invention there is provided such cleaning compositions that also contain polyhydroxylated phenol compounds employed as corrosion inhibitors which cleaning compositions inhibit binding of those polyhydroxylated phenol compounds to silanols on the silicon wafers being cleaned and thereby inhibit surface modification of the microelectronic substrates by the polyhydroxylated phenol corrosion inhibitors. In such further embodiments of the cleaning compositions of this invention the cleaning compositions additionally may contain:
(F) at least one polyhydroxylated phenol compound corrosion inhibitor; and
(G) at least one polyalcohol or polythiol surface modification agent containing vicinal hydroxyl or vicinal sulfhydryl groups to pair with the polyhydroxylated phenol compound corrosion inhibitor. If component (F) is present in the compositions of this invention then component (G) is also present. However, the compositions may contain component (G) without having component (F) present.
Such compositions are also capable of cleaning both aluminum and copper metalized microelectronic substrates.

The cleaning compositions of this invention may also optionally contain other non-essential but sometimes desirable components such as, for example,
(H) at least one polar organic solvent/co-solvent selected from sulfoxides, sulfones, amides, lactones, ethers, alcohols, tertiary alkanolamines, and alcohol ethers other than those employed as component (B); and
(I) at least one surfactant; and
(J) at least one metal chelating or complexing agent.

The semi-aqueous, alkaline microelectronic cleaning composition of this invention will have a pH of ≥8, preferably pH ≥9.5, both undiluted ("apparent pH") and as a 10% aqueous solution.

The at least one secondary alkanolamine that generates hydroxides when in contact with water is will generally be present in the cleaning composition in an amount of from about 0.1% to about 50%, preferably from about 0.5% to about 25%, more preferably from about 3% to about 15%, and still more preferably about 6%, by weight of the cleaning composition. Any suitable secondary alkanolamine that generates hydroxides when in contact with water may be employed in the compositions of this invention. Examples of such suitable secondary alkanolamine include, but are not limited to, diethanolamine, diisopropanolamine, N-ethylethanolamine, and N-methylethanolamine and mixtures thereof.

Any suitable organic alcohol ether solvent having an evaporation rate of 0.3 or less when n-butyl acetate's evaporation rate is taken as the baseline rate of 1.0 may be employed in the cleaning compositions of this invention. Glycol ethers are preferred. Such organic alcohol ether solvent will generally be present in the cleaning compositions in an amount of from about 5% to about 95%, preferably from about 20% to about 80%, more preferably from about 45% to about 70%, by weight of the composition. Examples of such suitable organic alcohol ether solvent include, but are not limited to ethylene glycol butyl ether (EGBE), diethylene glycol monomethyl ether (DEGME), diethylene glycol monoethyl ether (DEGEE, carbitol), butyl glycol, tetraethylene glycol, dipropylene glycol methyl ether, ethylene glycol monomethyl ether (EGME), ethylene glycol monoethyl ether (EGEE), ethylene glycol monopropyl ether (EGPE), diethylene glycol (DEG), diethylene glycol monoethyl ether (DEGEE), diethylene glycol monobutyl ether (DEGBE), propylene glycol monomethyl ether (PGME), dipropylene glycol (DPG), dipropylene glycol monomethyl ether (DPGME), ethylene glycol monoisopropyl ether, ethylene glycol monophenyl ether, ethylene glycol monobenzyl ether, triethylene glycol methyl ether, triethylene glycol ethyl ether, triethylene glycol butyl ether and mixtures thereof. The preferred organic alcohol ether is selected from ethylene glycol butyl ether, diethylene glycol monomethyl ether, diethylene glycol monoethyl ether, butyl glycol, tetraethylene glycol, dipropylene glycol methyl ether and mixtures thereof. Still more preferred is ethylene glycol butyl ether.

The at least one corrosion inhibiting cyclic amide compound will generally be present in the compositions in an amount of from about 5% to about 70%, preferably from about 5% to about 50%, more preferably from about 10% to about 30%, still more preferably from about 10% to about 20%, by weight of the composition. Any suitable corrosion inhibiting cyclic amide may be employed in the compositions of this invention. Examples of such suitable corrosion inhibiting cyclic amides include, but are not limited to, N-methylpyrrolidinone, N-ethylpyrrolidinone, N-propylpyrrolidinone, dimethyl-2-piperidone, 1-(2-hydroxyethyl)-2-pyrrolidinone, β-lactam, γ-lactam, δ-lactam, ε-lactam, 4-aminopetanoic acid lactam (γ-valerolactam) and mixtures thereof. Preferred corrosion inhibiting cyclic amide compounds are N-methylpyrrolidinone, N-ethylpyrrolidinone, N-propylpyrrolidinone, dimethyl-2-piperidone, 1-(2-hydroxyethyl)-2-pyrrolidinone and mixtures thereof. A still more preferred cyclic amide is N-methylpyrrolidinone.

The at least one pH balancing azole metal corrosion inhibitor component must be present in the compositions of his invention in an amount of no more than 0.08%, preferably no more than about 0.07%, more preferably no more than about 0.05%, and in a preferred embodiment no more than about 0.01%, by weight of the composition. Any suitable pH balancing azole metal corrosion inhibitors, especially triazoles and tetrazoles, may be employed in the compositions of this invention. Examples of such suitable pH balancing azole corrosion inhibitors include, but are not limited to benzotriazole, alkylbenzotriazoles such as methylbenzotriazole (e.g. 4- or 5-methylbenzotriazole), carboxybenzotriazole, benzimidazole, tetrazole, hydroxybenzotriazole, 2-mercaptobenzotriazole, 2-mercaptobenzimidazole, tolyltriazole, mercaptomethyl benzimidazole, 1,2,4-triazole, 3-amino-1,2,4-triazole, 1-phenyl-1H-tetrazole-5-thiol and mixtures thereof. Preferred azole metal corrosion inhibiting compounds are benzotriazole, carboxybenzotriazole, benzimidazole, tetrazole, hydroxybenzotriazole, 2-mercaptobenzotriazole, 2-mercaptobenzimidazole and mixtures thereof. Still more preferred azole metal corrosion inhibiting compounds are benzotriazole and methylbenzotriazole.

The cleaning compositions of this invention are semi-aqueous. The water in the compositions will generally be present in an amount of from about 5% to about 70%, preferably from about 5% to about 40%, more preferably from about 10% to about 30%, and in a preferred embodiment about 20%, by weight of the composition.

In a further embodiment of the cleaning compositions of this invention the composition include any suitable polyhydroxylated phenol corrosion inhibitor compound generally, when present in the compositions, in an amount of from greater than 0% to about 10%, preferably from about 0.1 to about 5%, more preferably from about 0.1% to about 1% and still more preferably from about 0.1% to about 0.5%, by weight of the composition. Any suitable polyhydroxylated phenol corrosion inhibitor compound may be employed and include, but are not limited to catechol (pyrocatechol), pyrogallol, gallic acid, a gallic acid alkyl ester (e.g. methyl gallate, propyl gallate), an alkylcatechol (e.g. methyl catechol, ethyl catechol and tert-butyl catechol) and mixtures thereof. Preferred polyhydroxylated phenol corrosion inhibitor compounds are to catechol (pyrocatechol), pyrogallol, gallic acid and mixtures thereof. A still more preferred polyhydroxylated phenol corrosion inhibitor compound is catechol.

When the foregoing polyhydroxylated phenol corrosion inhibitor compounds are included in the compositions of this invention the composition will also include at least one polyalcohol or polythiol surface modification inhibition agent containing vicinal hydroxyl or vicinal sulfhydryl groups to pair with the polyhydroxylated phenol compound corrosion inhibitor to act as a surface modification preventing agent to prevent or inhibit the binding of polyhydroxylated phenol compounds to silanols on the silicon wafers being cleaned. However, the at least one polyalcohol or polythiol surface modification inhibition agent containing vicinal hydroxyl or vicinal sulfhydryl groups may optionally be present in the compositions of this invention even when the polyhydroxylated phenol compound corrosion inhibitor component is not present. Any suitable polyalcohol or polythiol surface modification inhibition agent may be employed in the compositions of this invention. Examples of such suitable polyalcohol or polythiol surface modification inhibition agents include, but are not limited to, alkanediols, alkanetriols, alkanedithiols, phenyl substituted alkanediols, phenyl substituted alkanetriols, phenyl substituted alkanedithiols and mixtures thereof. Specific examples of polyalcohol or polythiol surface modification inhibition agents include, but are not limited to, ethylene glycol, propylene glycol, glycerol, butanediol, pentanediol, hexanediol, cyclohexanediol, 1,2-ethylene dithiol and mixtures thereof. Preferred polyalcohol or polythiol surface modification inhibition agents include ethylene glycol, propylene glycol, glycerol, butanediol, 1,2-ethylene dithiol and mixtures thereof. Such polyalcohol or polythiol surface modification inhibition agent compound generally will, when present in the compositions, be present in the composition in an amount of from greater than 0% to about 20%, preferably from about 1% to about 10%, more preferably from about 3% to about 10% and still more preferably from about 5% to about 10%, by weight of the composition.

The cleaning compositions of this invention may also optionally have present in the compositions at least one or more of the following components:

(H) at least one polar organic solvent/co-solvent selected from sulfoxides, sulfones, amides, lactones, ethers, alcohols, tertiary alkanolamines, and alcohol ethers other than those employed as component (B); and (I) at least one surfactant; and (J) at least one metal chelating or complexing agent.

Any suitable other polar organic solvent/co-solvent selected from sulfoxides, sulfones, amides, lactones, ethers, alcohols, tertiary alkanolamines, and alcohol ethers other than those employed as component (B) may optionally be employed in the compositions of this invention and will generally be present, when employed in the compositions, in an amount greater than 0% to about 50%, preferably from about 5% to about 50% and more preferably from about 5% to about 25%, by weight of the composition. Such suitable other organic polar solvent/co-solvent include, but are not limited to, dimethyl sulfoxide, sulfolane, methyl sulfone, ethyl sulfone, dimethylacetamide, formamide, butyrolactone, ethylene glycol dimethyl ether, ethylene glycol diethyl ether, ethylene glycol dibutyl ether, triethanolamine, N-methylforamide, N,N-dimethylformamide, benzyl alcohol, propanol, butanol, triethanolamine, glycol and mixtures thereof. Preferred as polar organic solvent/co-solvent are dimethyl sulfoxide, sulfolane, methyl sulfone, ethyl sulfone, dimethylacetamide, formamide, triethanolamine and N-methylformamide.

Any suitable surfactant may optionally be employed in the compositions of this invention. The surfactant may be any suitable amphoteric, cationic, anionic or non-ionic surfactant. Amphoteric surfactants useful in the compositions of the present invention include, but are not limited to, betaines and sulfobetaines such as alkyl betaines, amidoalkyl betaines, alkyl sulfobetaines and amidoalkyl sulfobetaines; aminocarboxylic acid derivatives such as amphoglycinates, amphopropionates, amphodiglycinates, and amphodipropionates; iminodiacids such as alkoxyalkyl iminodiacids or alkoxyalkyl iminodiacids; amine oxides such as alkyl amine oxides and alkylamido alkylamine oxides; fluoroalkyl sulfonates and fluorinated alkyl amphoterics; and mixtures thereof. Preferably, the amphoteric surfactants are cocoamidopropyl betaine, cocoamidopropyl dimethyl betaine, cocoamidopropyl hydroxy sultaine, capryloamphodipropionate, cocoamidodipropionate, cocoamphopropionate, cocoamphohydroxyethyl propionate, isodecyloxypropylimino dipropionic acid, laurylimino dipropionate, cocoamidopropylamine oxide and cocoamine oxide and fluorinated alkyl amphoterics. Non-ionic surfactants useful in the compositions of the present invention include, but are not limited to acetylenic diols, ethoxylated acetylenic diols, fluorinated alkyl alkoxylates, fluorinated alkylesters, fluorinated polyoxyethylene alkanols, aliphatic acid esters of polyhydric alcohols, polyoxyethylene monoalkyl ethers, polyoxyethylene diols, siloxane type surfactants, and alkylene glycol monoalkyl ethers. Preferably, the non-ionic surfactants are acetylenic diols or ethoxylated acetylenic diols. Anionic surfactants useful in the compositions of the present invention include, but are not limited to, carboxylates, N-acylsarcosinates, sulfonates, sulfates, and mono and diesters of orthophosphoric acid such as decyl phosphate. Preferably, the anionic surfactants are metal-free surfactants. Cationic surfactants useful in the compositions of the present invention include, but are not limited to, amine ethoxylates, dialkyldimethylammonium salts, dialkylmorpholinum salts, alkylbenzyldimethylammonium salts, alkyltrimethylammonium salts, and alkylpyridinium salts. Preferably, the cationic surfactants are halogen-free surfactants. If a surfactant component is employed it will preferably be an acetylenic diol surfactants. Examples of especially suitable surfactants include, but are not limited to 3,5-dimethyl-1-hexyn-3-ol (Surfynol-61), ethoxylated 2,4,7,9-tetramethyl-5-decyne-4,7-diol (Surfynol-465), polytetrafluoroethylene cetoxypropylbetaine (Zonyl FSK), Zonyl FSH, Triton X-100, namely octylphenoxypolyethoxyethanol, and the like. Such surfactant component, when present, will generally be present in an amount of from greater than 0% to about 5%, preferably from about 0.01% to about 1%, and more preferably from about 0.01 to about 0.2%, by weight of the composition.

Any suitable metal chelating or complexing agent may be optionally included in the compositions of this invention and, when present will generally be present in an amount of from greater than 0% to about 5%, preferably from about 0.01% to about 5%, and more preferably from about 0.1 to about 1%, by weight of the composition. Such suitable metal chelating or complexing agent include, but are not limited to, the following organic acids and their isomers and salts: (ethylenedinitrilo)tetraacetic acid (EDTA), butylenediaminetetraacetic acid, cyclohexane-1,2-diaminetetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), aminotrimethylenephosphonic acid, citric acid, tartaric acid, gluconic acid, saccharic acid, glyceric acid, oxalic acid, phthalic acid, maleic acid, mandelic acid, malonic acid, lactic acid, salicylic acid, 8-hydroxyquinoline, and cysteine. Preferred as the metal chelating agents are aminocarboxylic acids such as cyclohexane-1,2-diaminetetraacetic acid and 1,3-diamino-2-hydroxypropane-N,N,N',N'-tetraacetic acid.

The cleaning compositions of this invention are compatible with both copper and aluminum metallizations not only when used in undiluted (neat) form, but also when they are diluted with large amounts of water during water rinse stage following cleaning. For example the compositions of this invention have low Al and Cu etch rates with 95:5 water:cleaner mixtures. Additionally the compositions of this invention show good aluminum and copper compatibilities even under very demanding high oxygen/air exposure conditions. Low etch rates were obtained even with air bubbling thought the cleaner compositions.

The compositions of this invention may be employed to clean microelectronic substrates having either aluminum or copper metallization especially those with low-k dielectrics. The cleaning compositions are brought into contact with the microelectronic substrates for a time and at a temperature sufficient to clean the substrate of one or more of photoresist, UV/plasma hardened photoresist, and post plasma etch or post etch/ash residue. The compositions may then be diluted with large volumes of water to provide a rinse solution to be used on the substrate following the cleaning step. The time of the contact of the substrate with the cleaning composition may be from about 1 minute to about 30 minutes and at a temperature that may be from about 25° C. to about 85° C.

Examples of preferred embodiments of compositions of this invention include, but are not limited to, the following compositions. In Table 1 the following abbreviations are employed.

EGBE=ethylene glycol butyl ether
NMP=N-methylpyrrolidonone
EG=ethylene glycol
PG=propylene glycol
PEG200=polyethylene glycol 200
$H_2O$=water
DEA=diethanolamine
CAR=carbitol
BZT=benzotriazole
MBZT=methylbenzotriazole
CAT=catechol

TABLE 1

| Component | Comp. 1 366 | Comp. 2 3091 | Comp. 3 3101 | Comp. 4 3112 | Comp. 5 3115 | Comp. 6 3116 |
|---|---|---|---|---|---|---|
| EGBE | 48.73 | 48.73 | 44 | 48.93 | 48.93 | 48.93 |
| DEA | 6 | 6 | 6 | 6 | 6 | 6 |
| NMP | 20 | 20 | 30 | 20 | 20 | 20 |
| $H_2O$ | 20 | 20 | 20 | 20 | 20 | 20 |
| BZ | 0.07 | — | 0.07 | 0.07 | 0.07 | — |
| MBZ | — | 0.07 | — | — | — | 0.07 |
| CAT | 0.2 | 0.2 | 0.1 | — | — | — |
| EG | 5 | 5 | — | — | — | — |
| PG | — | — | — | — | 5 | 5 |
| PSG200 | — | — | — | 5 | — | — |

In the Table the amounts are expressed as parts by weight. These Composition 1-6 have inhibited Cu ion/azole complex formation compared to similar compositions with more than 0.08% azole component and also compared similar compositions without the at least one organic alcohol ether solvent having an evaporation rate of 0.3 or less or without the at least one secondary alkanolamine that generates hydroxides when in contact with water, or without the at least one corrosion inhibiting cyclic amide compound.

Example 1

The favorable substrate compatibility/etch rates of compositions of this invention is shown by the data in Table 2.

TABLE 2

| Composition No. | Cu etch rate Å/min; 60° C. | Al etch rate Å/min; 60° C. | Cu etch rate Å/min; 5% soln., 25° C. | Al etch rate Å/min; 5% soln., 25° C. | pH of 10% soln. |
|---|---|---|---|---|---|
| 2 | 4.2 | 2.2 | 0 | 1 | 10.28 |
| 4 | 6.3 | 0.5 | — | — | 10.52 |
| 5 | 4.3 | 0.9 | 0 | 27.4 | 10.58 |
| 6 | 1.7 | 1.0 | 0 | 29.1 | 10.55 |

| | Cu etch rate Å/min; 55° C. | Al etch rate Å/min; 55° C. | Cu etch rate Å/min; 5% soln., 25° C. | Al etch rate Å/min; 5% soln., 25° C. | pH of 5% soln. |
|---|---|---|---|---|---|
| 3 | 7.2 | 3.8 | 4.0 | 1.6 | 10.26 |
| 1 | 1.1 | 4.0 | 0 | 0.3 | 10.16 (10% soln. |

| | Cu etch rate Å/min; 50° C. | Al etch rate Å/min; 50° C. | Cu etch rate Å/min; 5% soln., 25° C. | Al etch rate Å/min; 5% soln., 25° C. | pH of 5% soln. |
|---|---|---|---|---|---|
| 1 | 4.4 | 1.7 | 0 | 0.3 | 9.94 |

The Cu(1)/azole polymer reduction or minimization property of the combination of the combination of the secondary alcohol with the cyclic amide corrosion inhibitor component is illustrated by the following example.

Example 2

Cu/BZT polymer was generated by immersing a silicon substrate wafer in a cleaner composition of 40 parts by weight dimethyl sulfoxide, 6 parts by weight diethanolamine, 60 parts by weight water and 0.5 parts by weight benzotriazole for 20 minutes at 60° C. with stirring at a stirring rate of 100 rpm to produce undesirable Cu/BZT polymer loaded substrate. The resulting undesirable Cu/BZT polymer substrate was cut into pieces of equal sizes. Each piece of Cu/BZT polymer loaded substrate was then immersed in different solutions at 60° C. for the specified time with stirring at 300 rpm. These solution-treated substrate pieces were examined and evaluated for the Cu/BZT polymer removal efficiencies with a scale of Cu/BZT polymer loading scale of from 0=for no detectable CU/BZT polymer loading to 10 for very heavy loading of Cu/BZT polymer loading. The results are set fort in Table 3 where DEA=diethanolamine, NMP=N-methylpyrrolidinone, and DMSO=dimethyl sulfoxide.

TABLE 3

| Test No. | Chemical Composition of Solution | Treatment Time (minutes) | Polymer Loading before Treatment | Polymer Loading after Treatment | Polymer Removal Efficiency (%) |
|---|---|---|---|---|---|
| 1 | 1% DEA in NMP | 12 | 10 | 5 | 50 |
| 2 | 1% DEA in NMP | 20 | 10 | 0 | 100 |
| 3 | 1% DEA in DMSO | 12 | 10 | 10 | 0 |
| 4 | 1% DEA in DMSO | 20 | 10 | 9 | 10 |

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims

The invention claimed is:

1. A semi-aqueous, alkaline microelectronic cleaning composition for cleaning a microelectronic substrate, said composition having a pH >8 comprising:
   (A) at least one secondary alkanolamine that generates hydroxides when in contact with water;
   (B) at least one organic alcohol ether solvent having an evaporation rate of 0.3 or less when n-butyl acetate's evaporation rate is taken as the baseline rate of 1.0;
   (C) at least one corrosion inhibiting cyclic amide compound;
   (D) at least one pH balancing azole metal corrosion inhibitor in an amount of 0.07% or less by weight of the composition; and
   (E) water; and optionally
   (F) at least one polyhydroxylated phenol compound corrosion inhibitor; and
   (G) at least one polyalcohol or polythiol surface modification agent containing vicinal hydroxyl or vicinal sulfhydryl groups to pair with the at least one polyhydroxylated phenol compound corrosion inhibitor with the proviso that if component (F) is present in the compositions then component (G) is also present but, the compositions may contain component (G) without having component (F) present; wherein said composition is used to clean said microelectronic substrate alone or prior to a rinsing step.

2. A semi-aqueous, alkaline microelectronic cleaning composition according to claim 1 wherein the composition wherein the optional components (F) and (G) are both present in the composition.

3. A composition according to claim 1 wherein the composition has a pH of >9.5.

4. A composition according to claim 1 wherein the secondary alkanolamine component:
   (A) is present in the composition in an amount of from about 0.1% to about 50% by weight, the organic alcohol ether solvent;
   (B) is present in the composition in an amount of from 5% to about 95% by weight, the cyclic amide corrosion inhibitor component;
   (C) is present in the composition in an amount of from about 5% to about 70% by weight, and the water component;

(E) is present in the composition in an amount of from 5% to about 75% by weight, wherein the percentages by weight are based on the weight of the composition.

5. A composition according to claim 1 wherein the secondary alkanolamine component (A) is selected from the group consisting of diethanolamine, diisopropanolamine, N-ethylethanolamine, N-methylethanolamine, and mixtures thereof.

6. A composition according to claim 1 wherein the organic alcohol ether solvent component (B) is selected from the group consisting of ethylene glycol butyl ether, diethylene glycol monomethyl ether, carbitol, butyl glycol, tetraethylene glycol dipropylene glycol methyl ether, ethylene glycol monomethyl ether, ethylene glycol monoethyl ether, ethylene glycol monopropyl ether, diethylene glycol, diethylene glycol monoethyl ether, diethylene glycol monobutyl ether, propylene glycol monomethyl ether, dipropylene glycol, dipropylene glycol monomethyl ether, ethylene glycol monoisopropyl ether, ethylene glycol monophenyl ether, ethylene glycol monobenzyl ether, triethylene glycol methyl ether, triethylene glycol ethyl ether, triethylene glycol butyl ether and mixtures thereof.

7. A composition according to claim 6 wherein the organic alcohol ether solvent component (B) is selected from the group consisting of ethylene glycol butyl ether, diethylene glycol monomethyl ether, carbitol, butyl glycol, tetraethylene glycol dipropylene glycol methyl ether and mixtures thereof.

8. A composition according to claim 1 wherein the cyclic amide component (C) is selected from the group consisting of N-methylpyrrolidinone, N-ethylpyrrolidinone, dimethyl-2-piperidone, 1-(2-hydroxyethyl)-2-pyrrolidinone, 13-lactam, 7-lactam, 5-lactam, s-lactam, 4-aminopetanoic acid lactam (7-valerolactam), and mixtures thereof.

9. A composition according to claim 8 wherein the cyclic amide component (C) is selected from the group consisting of N-methylpyrrolidinone, N-ethylpyrrolidinone, dimethyl-2-piperidone, 1-(2-hydroxyethyl)-2-pyrrolidinone, and mixtures thereof.

10. A composition according to claim 1 wherein the azole component (D) is selected from the group consisting of benzotriazole, an alkylbenzotriazole, benzimidazole, tetrazoles, hydroxybenzotriazole, carboxybenzotriazole, 2-mercaptobenzotriazole, 2-mercaptobenzimidazole, tolyltriazole, mercaptomethyl benzimidazole, 1,2,4-triazole, 3-amino-1,2,4-triazole, 1-phenyl-1H-tetrazole-5-thiol and mixtures thereof.

11. A composition according to claim 10 wherein the azole component (D) is selected from the group consisting of benzotriazole, methylbenzotriazole, benzimidazole, tetrazoles, hydroxybenzotriazole, carboxybenzotriazole, 2-mercaptobenzotriazole, 2-mercaptobenzimidazole, and mixtures thereof.

12. A composition according to claim 1 wherein the polyhydroxylated phenol component (F) is selected from the group consisting of catechol, pyrogallol, gallic acid, a gallic acid alkyl ester, an alkylcatechol and mixtures thereof and the polyalcohol or polythiol component (G) is selected from the group consisting of alkanediols, alkanetriols, alkanedithiols, phenyl substituted alkanediols, phenyl substituted alkanetriols, phenyl substituted alkanedithiols and mixtures hereof.

13. A composition according to claim 12 wherein the polyhydroxylated phenol component (F) is selected from the group consisting of catechol, pyrogallol, gallic acid, and mixtures thereof and the polyalcohol or polythiol component (G) is selected from the group consisting of ethylene glycol, propylene glycol, glycerol, butanediol, cyclohexanediol, 1,2-ethylene dithiol and mixtures hereof.

14. A composition according to claim 1 wherein the secondary alkanolamine component (A) is selected from the group consisting of diethanolamine, diisopropanolamine, N-ethylethanolamine, N-methylethanolamine, and mixtures thereof, the organic alcohol ether solvent component (B) is selected from the group consisting of ethylene glycol butyl ether, diethylene glycol monomethyl ether, carbitol, butyl glycol, tetraethylene glycol dipropylene glycol methyl ether and mixtures thereof, the cyclic amide component (C) is selected from the group consisting of N-methylpyrrolidinone, N-ethylpyrrolidinone, dimethyl-2-piperidone, 1-(2-hydroxyethyl)-2-pyrrolidinone and mixtures thereof, the azole component (D) is selected from the group consisting of benzotriazole, methylbenzotriazole, carboxybenzotriazole, benzimidazole, tetrazoles, hydroxybenzotriazole, 2-mercaptobenzotriazole, 2-mercaptobenzimidazole and mixtures thereof, and the polyhydroxylated phenol component (F) is selected from the group consisting of catechol, pyrogallol, gallic acid and mixtures thereof and the polyalcohol or polythiol component (G) is selected from the group consisting of ethylene glycol, propylene glycol, glycerol, butanediol, 1,2-ethylene dithiol and mixtures hereof.

15. A composition according to claim 14 wherein the secondary alkanolamine component
   (A) is diethanolamine, the organic alcohol ether solvent component (II) is selected from the group consisting of ethylene glycol butyl ether, diethylene glycol monomethyl ether, carbitol, butyl glycol, tetraethylene glycol dipropylene glycol methyl ether, the cyclic amide component (C) is N-methylpyrrolidinone, the azole component (D) is selected from the group consisting of benzotriazole and, methylbenzotriazole, and the polyhydroxylated phenol component (F) is catechol, and the polyalcohol or polythiol component (G) is selected from the group consisting of ethylene glycol and propylene glycol.

16. A composition according to claim 1 additionally comprising at least one of the following additional components:
   (H) at least one polar organic solvent/co-solvent selected from the group consisting of sulfoxides, sulfones, amides, lactones, ethers, alcohols, tertiary alkanolamines, and alcohol ethers other than those employed as component (B); and
   (I) at least one surfactant; and
   (J) at least one metal chelating or complexing agent.

17. A process for cleaning a microelectronic substrate by removing one or more of photoresist, UV/plasma hardened photoresist, post plasma etch or post etch/ash residue from the substrate comprising contacting the microelectronic substrate with a cleaning composition for a time and at a temperature effective for such removal to occur, said cleaning composition comprising
   (A) at least one secondary alkanolamine that generates hydroxides when in contact with water;
   (B) at least one organic alcohol ether solvent having an evaporation rate of 0.3 or less when n-butyl acetate's evaporation rate is taken as the baseline rate of 1.0;
   (C) at least one corrosion inhibiting cyclic amide compound;
   (D) at least one pH balancing azole metal corrosion inhibitor in an amount of 0.07% or less by weight of the composition; and
   (E) water; and optionally (F) at least one polyhydroxylated phenol compound corrosion inhibitor; and
(G) at least one polyalcohol or polythiol surface modification agent containing vicinal hydroxyl or vicinal sulfhydryl groups to pair with the at least one polyhydroxylated phenol compound corrosion inhibitor with the proviso that if component (F) is present in the compositions then component (G) is also present but, the compositions may contain component (G) without having component (F) present, and having a pH >8, wherein said composition is used to clean said microelectronic substrate alone or prior to a rinsing step.

18. A process according to claim 17 wherein the microelectronic substrate is a silicon wafer or glass substrate and the cleaning composition inhibits or minimizes formation of Cu(1)/azole polymer formation during the cleaning process.

* * * * *